United States Patent
Fang et al.

(10) Patent No.: US 9,531,387 B2
(45) Date of Patent: Dec. 27, 2016

(54) HANDHELD DEVICE AND FREQUENCY TRACKING METHOD THEREOF

(71) Applicant: MEDIATEK INC., Hsinchu (TW)

(72) Inventors: Chun-Jen Fang, Zhudong Township (TW); Ching-Sheng Wu, Kaohsiung (TW); Meng-Lin Wu, Keelung (TW); Chih-Ming Wang, Magong (TW); Chiao-Chih Chang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 14/587,128

(22) Filed: Dec. 31, 2014

(65) Prior Publication Data

US 2015/0282156 A1 Oct. 1, 2015

Related U.S. Application Data

(60) Provisional application No. 61/971,906, filed on Mar. 28, 2014.

(51) Int. Cl.
| | |
|---|---|
| *H04B 7/00* | (2006.01) |
| *H04B 15/00* | (2006.01) |
| *H03L 1/02* | (2006.01) |
| *H04B 1/3827* | (2015.01) |

(52) U.S. Cl.
CPC ......... *H03L 1/02* (2013.01); *H04B 2001/3861* (2013.01)

(58) Field of Classification Search
CPC .......................... H04W 72/04; H04W 72/048
USPC ........................ 455/73, 422.1, 509
See application file for complete search history.

(56) References Cited

U.S. PATENT DOCUMENTS

| | | | | |
|---|---|---|---|---|
| 5,872,810 A | * | 2/1999 | Philips ................... | H04B 1/707 375/130 |
| 2011/0187422 A1 | * | 8/2011 | Hammes ................ | H03L 1/026 327/156 |
| 2012/0075992 A1 | * | 3/2012 | Shahidi .................. | H04B 1/036 370/235 |
| 2016/0218718 A1 | * | 7/2016 | Yamamoto ............. | H03B 5/323 |
| 2016/0218719 A1 | * | 7/2016 | Yamamoto ............. | H03B 5/364 |

* cited by examiner

*Primary Examiner* — Tilahun B Gesesse
(74) *Attorney, Agent, or Firm* — Cantor Colburn LLP

(57) ABSTRACT

A handheld device and a frequency tracking method thereof are provided. The handheld device comprises an oscillator, a radio frequency (RF) chip, a modem module, a first thermal sensor and a thermal module. The oscillator generates an oscillation signal with an oscillation frequency. The RF chip is electrically connected to the oscillator and configured to receive a paging signal from a paging channel and an RF signal from a non-regular channel based on the oscillation signal. The modem module is electrically connected to the RF chip. The first thermal sensor disposed close to the oscillator measures a heat source temperature. The thermal module electrically connected to the modem module and the first thermal sensor enables the modem module to execute a frequency compensation process by using the RF signal of both the paging signal and the RF signal according to the heat source temperature.

20 Claims, 12 Drawing Sheets

HANDHELD DEVICE AND FREQUENCY TRACKING METHOD THEREOF

CROSS-REFERENCES TO RELATED APPLICATIONS

The present invention claims priority under 35 U.S.C. §119 to U.S. Provisional Application No. 61/971,906 filed Mar. 28, 2014, the entire content of which is incorporated herein by reference.

BACKGROUND OF THE INVENTION

Field of the Invention

The present invention relates to a handheld device and a frequency tracking method thereof. More particularly, the handheld device of the present invention triggers modem module to execute a frequency compensation process according to a heat source temperature to reduce the impact of oscillator frequency offset caused by a heat source.

Descriptions of the Related Art

With the development of communication technologies, the wireless handheld device has been widely used in people's daily life. To meet the compact design of the handheld device, it is hard to avoid disposing the oscillator close to the baseband (BB) processor which is a critical heat source of the handheld device.

Since the frequency of the oscillator is sensitive to the change in temperature, the large change in temperature (e.g., when BB processor becomes busy or turned-off) may cause large frequency offset in the oscillator. The frequency offset is accumulated until the Modem wakes up to receive the signal from the paging channel. However, the current frequency tracking mechanism which only uses the periodic signal received from the paging channel is unable to deal with large frequency offset, and consequently the related modem channel reception may fail.

Accordingly, an urgent need exists in the art to deal with large frequency offset caused by the large change in temperature around the oscillator so as to prevent the failure of related modem channel reception due to large frequency offset.

SUMMARY OF THE INVENTION

An objective of the present invention is to provide a frequency tracking mechanism for the handheld device to trigger the modem module to execute a frequency compensation process according to the change in temperature around the oscillator. By the frequency tracking mechanism of the present invention, the frequency compensation process can be executed timely so as to prevent the failure of related modem channel reception due to large frequency offset.

To achieve the aforesaid objective, the present invention discloses a handheld device comprising an oscillator, a radio frequency (RF) chip, a modem module, a first thermal sensor and a thermal module. The oscillator generates an oscillation signal. The RF chip is electrically connected to the oscillator and configured to receive a paging signal from a paging channel and an RF signal from a non-regular channel based on the oscillation signal. The modem module is electrically connected to the RF chip. The first thermal sensor disposed close to the oscillator measures a heat source temperature. The thermal module electrically connected to the modem module and the first thermal sensor enables the modem module to execute a frequency compensation process by using the RF signal or both the paging signal and the RF signal according to the heat source temperature.

Furthermore, the present invention further discloses a frequency tracking method for use in a handheld device. The handheld device comprises an oscillator, a radio frequency (RF) chip, a modem module, a first thermal sensor and a thermal module. The RF chip is configured to receive a paging signal from a paging channel and an RF signal from a non-regular channel based on an oscillation signal generated by the oscillator. The first thermal sensor is disposed close to the oscillator and configured to measure a heat source temperature. The frequency tracking method executed by the thermal module comprises the following steps: (a) reading the heat source temperature from the first thermal sensor; and (b) enabling the modem module to execute a frequency compensation process by using the RF signal or both the paging signal and the RF signal according to the heat source temperature.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following description, the present invention will be explained with reference to embodiments thereof. The present invention relates to a handheld device and a frequency tracking method thereof. It should be appreciated that, these embodiments of the present invention are not intended to limit the present invention to any specific environment, applications or implementations described in these embodiments. Therefore, description of these embodiments is only for purpose of illustration rather than to limit the present invention. The scope claimed in this application shall be governed by the claims. Additionally, in the following embodiments and the attached drawings, elements unrelated to the present invention are omitted from depiction, and dimensional relationships among individual elements in the attached drawings are illustrated only for case of understanding, but not to limit the actual scale.

Figure 1A:
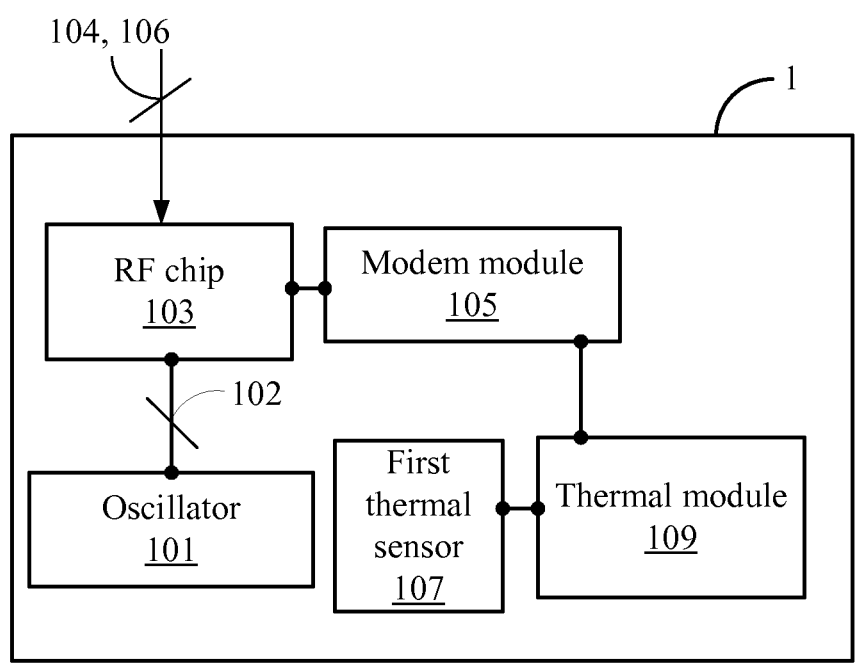
FIG. 1A is a schematic view of a handheld device 1 according to a first embodiment of the present invention.

The first embodiment of the present invention is depicted in FIG. 1A which is a schematic view of a handheld device 1. The handheld device 1 comprises an oscillator 101, a radio frequency (RF) chip 103, a modem module 105, a first thermal sensor 107 and a thermal module 109. The handheld device 1 may be a smart phone, a tablet computer, or any other device with communication capability and conforming to one of a second generation (2G) mobile communication standard, a third generation (3G) mobile communication standard and a fourth generation (4G) mobile communication standard. It shall be noted that, for the purpose of simplicity, other elements of the handheld device 1, such as a display module, an antenna module, a power module and elements less related to the present invention, are all omitted from depiction herein The oscillator 101 is configured to generate an oscillation signal 102 with an oscillation frequency. Specifically, the oscillator 101 may be a crystal oscillator or a frequency synthesizer, e.g., Digitally Controlled Oscillator (DCXO) and is disposed close to a heat source (e.g. a processor). In this case, heat produced by the heat source would cause the frequency of the oscillator 101 to vary as the change in temperature.

The radio frequency (RF) chip 103 electrically connected to the oscillator 101 operates based on the oscillation signal 102 to receives the RF signals from the specific frequency bands. In general case, the RF chip 103 receives a paging signal 104 from a paging channel periodically for the purpose of frequency tracking and receives RF signals 106 from other non-regular channels for the purposes of data transmission, communication control etc. except for the purpose of frequency tracking.

For example, when the handheld device 1 conforms to the second generation (2G) mobile communication standard, the non-regular channels include a broadcast control channel (BCCH), a frequency correction control channel (FCCH), a synchronization channel (SCH), a cell broadcast channel (CBCH), an access grant control channel (AGCH), and a notification channel (NCH). In addition, when the handheld device 1 conforms to the third generation (3G) mobile communication standard, the non-regular channels include a common pilot channel (CPICH), a primary-common control physical channel (P-CCPCH), a secondary-common control physical channel (S-CCPCH), a synchronization channel (SCH), an acquisition indicator channel (AICH) and a paging indicator channel (PICH). And, when the handheld device 1 conforms to the fourth generation (4G) mobile communication standard, the non-regular channels include a physical broadcast channel (PBCH), a physical multicast channel (PMCH), a physical control format indicator channel (PCFICH), a physical hybrid ARQ indicator channel (PHICH), a physical downlink control channel (PDCCH) and a physical downlink shared channel (PDSCH).

The modem module 105 is electrically connected to the RF chip 103 and the thermal module 109. The first thermal sensor 107 is electrically connected to the thermal module 109 and disposed close to the oscillator 101 to measure a heat source temperature around the oscillator 101. In another embodiment, the first thermal sensor 107 can be deposited on the oscillator 101. The position of the first thermal sensor 107 can be varied depending on the practical implementation and is not intended to limit the scope of the present disclosure. The thermal module 109 reads the heat source temperature from the first thermal sensor 107 and enables the modem module 105 to execute a frequency compensation process by using the paging signal 104 from the paging channel and the RF signal 106 from one or more of non-regular channels according to the heat source temperature. It shall be noted that, those of ordinary skill in the art can easily appreciate that the modem module 105 may perform the frequency compensation process by using the RF signal from one non-regular channel or a number of non-regular channels, depending on the practical design; therefore, the number of the non-regular channels is not to limit the present invention.

For example, the thermal module 109 may calculate a temperature change rate of the heat source temperature, and enable the modem module 105 to execute the frequency compensation process by using the paging signal 104 and the RF signal 106 when the temperature change rate is larger than a first threshold. The first threshold is predetermined based on the oscillator's frequency offset characteristic (i.e., relationship between frequency offset versus temperature change).

Specifically, when the heat source temperature rises or falls significantly during the time interval between two consecutive paging signals 104, it is hard for the modem module 105 to accurately estimate the large frequency offset only based on the paging signals 104 for the frequency compensation process or to receive the in-band RF signal based on the offset oscillator frequency. Consequently, the related modem channel reception will fail. To prevent the failure of the related modem channel reception, the present invention further observes the heat source temperature and additionally utilizes the RF signal 106 from the non-regular channel which is received more frequently than the paging signals 104 for frequency compensation process.

It should be noted that in practice, the frequency compensation process can be achieved by the signal processing and/or by adjusting the oscillation frequency of the oscillator 101 in case the oscillator 101 is a frequency synthesizer. How to execute the frequency compensation process by signal processing and/or adjustment of the oscillation frequency of the oscillator synthesizer is already known by those of ordinary skill in this art, and thus, will not be further described herein.

Figure 1B:
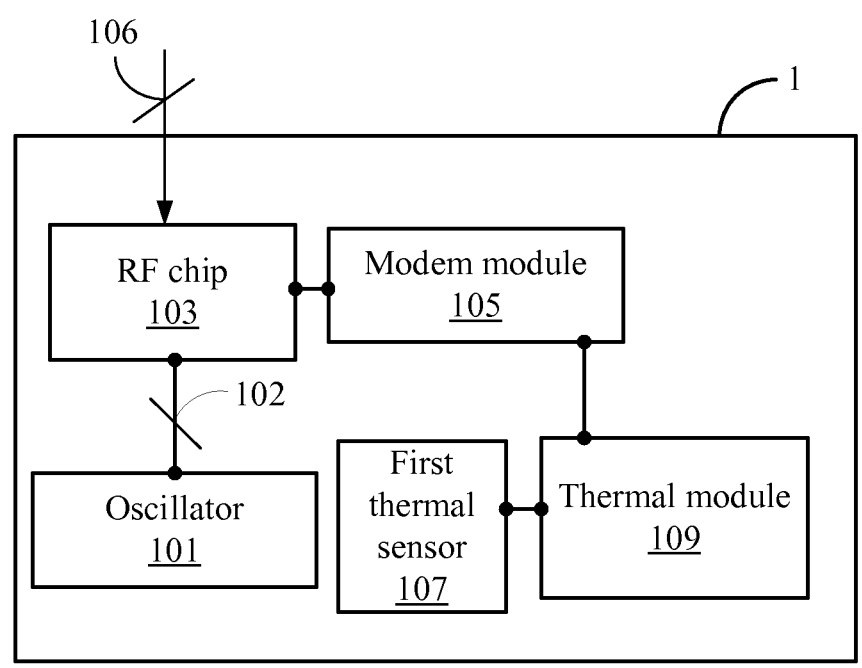
FIG. 1B is a schematic view of a handheld device 1 according to another embodiment of the present invention.

In other embodiment as shown in FIG. 1B, the thermal module 109 enables the modem module 105 to execute a frequency compensation process by only using the RF signal 106 according to the heat source temperature. In this embodiment, the thermal module 109 triggers the modem module 105 to track the frequency offset by only utilizing the RF signal 106 instead of utilizing both the paging signal 104 and the RF signal 106 since the RF signal 106 frequently received from one or more of non-regular channels is enough for timely compensating the frequency offset. Those of ordinary skill in this art can easily appreciate how the thermal module 109 triggers the modem module 105 to track the frequency offset by only utilizing the RF signal 106 based on the above description, and thus, will not be further described herein.

Figure 2A:
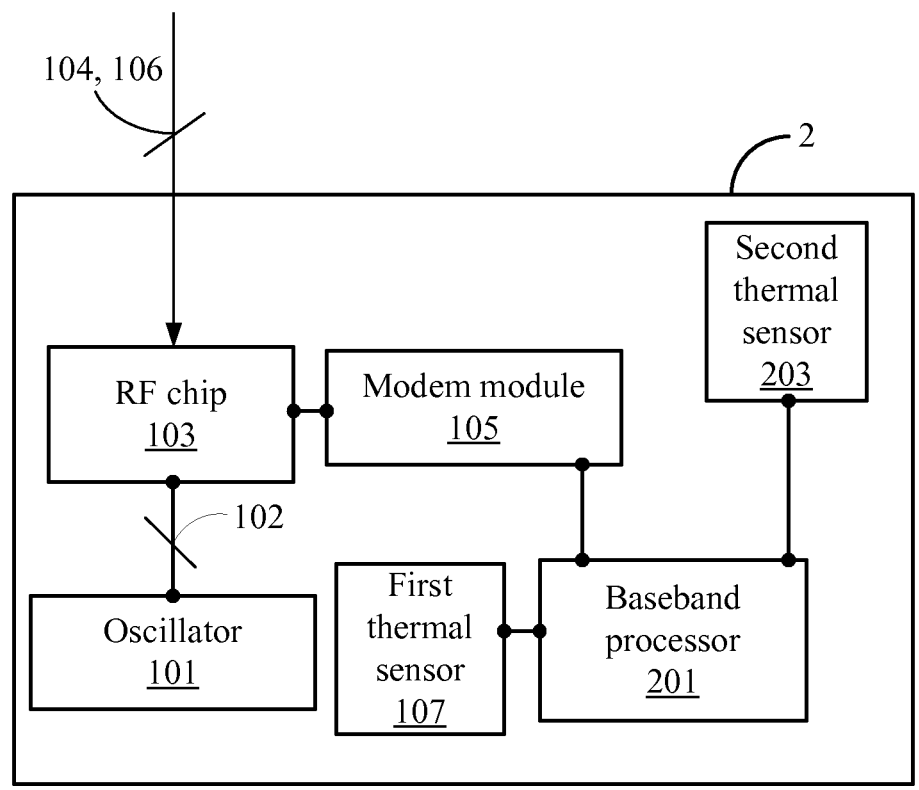
FIG. 2A is a schematic view of a handheld device 2 according to a second embodiment of the present invention.

The second embodiment of the present invention is depicted in. FIG. 2A which is a schematic view of a handheld device 2. In this embodiment, the handheld device 2 further comprises a baseband (BB) processor 201 which replaces the thermal module 109 in the first embodiment and a second thermal sensor 203. In other words, the BB process 201 plays the role as the thermal module 109. The first thermal sensor 107 is electrically connected to the BB process 201 and disposed close to the oscillator 101

The second thermal sensor 203 is electrically connected to the baseband processor 201 and configured to measure an ambient temperature, e.g., the temperature which is not close to the heat source. Once the BB processor 201 turns on, it reads the heat source temperature from the first thermal sensor 107 and determines whether the BB processor 201 will be turned off or not. For example, if there is no input signal inputted by the physical button, the touch panel or other input elements of handheld device 2 for a while, the BB processor 201 determines that the BB processor 201 will be turned off since it shows that the handheld device 2 is not operated by the user now.

When the BB processor 201 will not be turned off, the BB processor 201 calculates a temperature change rate of the heat source temperature, and determines whether the temperature change rate is larger than a first threshold. Afterwards, the BB processor 201 enables the modem module 105 to execute the frequency compensation process by using the paging signal 104 and the RF signal 106 when the temperature change rate is larger than the first threshold.

Conversely, when the BB processor 201 will be turned off, the BB processor 201 reads the ambient temperature from the second thermal sensor 203. Next, the BB processor 201 calculates a temperature difference between the heat source temperature and the ambient temperature and determines whether the temperature difference is larger than a second threshold. And, the BB processor 201 enables the modem module 105 to execute the frequency compensation process by using the paging signal 104 and the RF signal 106 when the temperature difference is larger than the second threshold.

In detail, this embodiment assumes that the BB processor 201 is disposed close to the oscillator 101 so that it is a critical heat source to the oscillator 101, and the first thermal sensor 107 is also disposed close to the oscillator 101 or alternatively onto the BB processor 201. In this case, the significant change in temperature around the oscillator 101 will occur when the BB processor 201 becomes busy or when it is just turned off. By the above-mentioned mechanism, the modem module 105 could be timely triggered to execute the frequency compensation process regardless of an on-state or off-state of the handheld device 2 (i.e., BB processor 201 is turned on or turned off) so as to prevent the failure of related modem channel reception due to large frequency offset caused by the large change in temperature of the oscillator 101.

Figure 2B:
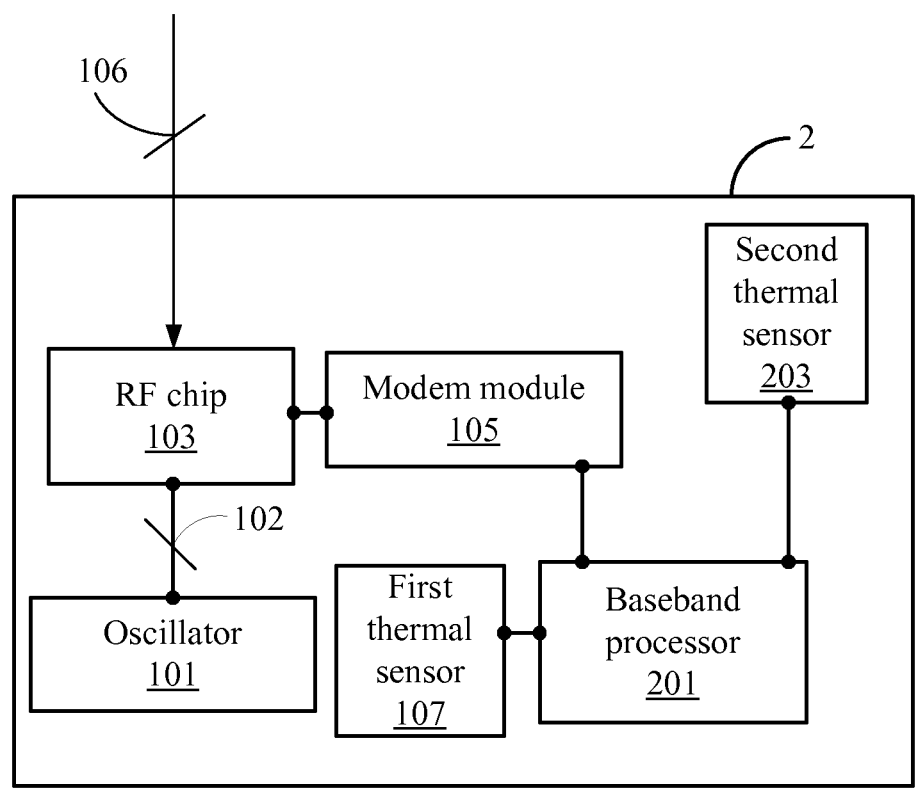
FIG. 2B is a schematic view of a handheld device 2 according to a another embodiment of the present invention.

Similarly, FIG. 2B shows another embodiment of the present invention. In this embodiment, the baseband processor 201 triggers the modem module 105 to track the frequency offset by only utilizing the RF signal 106 instead of utilizing both the paging signal 104 and the RF signal 106. As aforementioned, since the RF signal 106 frequently received from one or more of non-regular channels is enough for timely compensating the frequency offset, the paging signal 104 is optional in the frequency tracking mechanism of the present application.

Figure 3A:
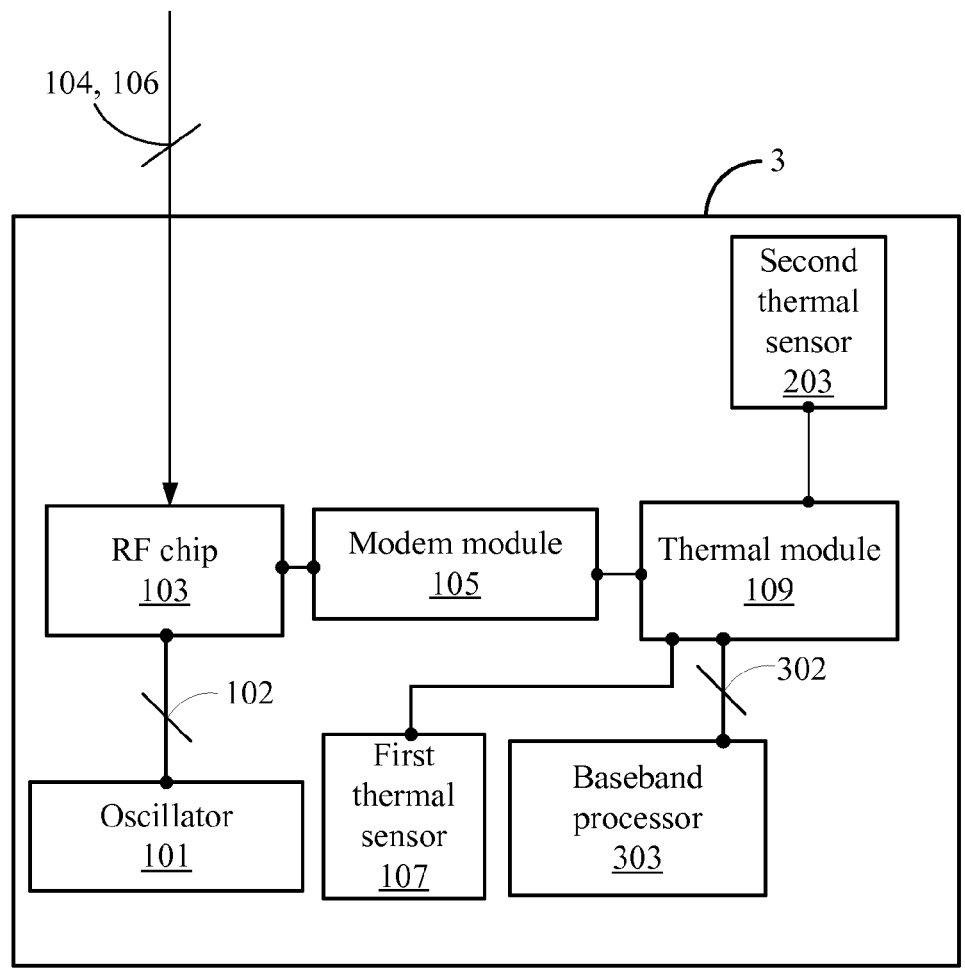
FIG. 3A is a schematic view of a handheld device 3 according to a third embodiment of the present invention.

Please refer to FIG. 3A for a third embodiment of the present invention. FIG. 3A is a schematic view of a handheld device 3. Different from the handheld device 1 of the first embodiment, the handheld device 3 further comprises a baseband (BB) processor 303 and the second thermal sensor 203, both of which are electrically connected to the thermal module 109.

In addition, this embodiment also assumes that the BB processor 303 is disposed close to the oscillator 101 so that it is a critical heat source to the oscillator 101 and the first thermal sensor 107 is disposed close to the oscillator 101 or alternatively onto the BB processor 303. In this case, the significant change in temperature around the oscillator 101 will occur when the BB processor 303 becomes busy or when it is just turned off.

The BB processor 303 determines whether the BB processor 303 will be turned off and transmits an indication signal 302 to the thermal module 109. When the indication signal 302 indicates that the BB processor 303 will not be turned off, the thermal module 109 calculates a temperature change rate of the heat source temperature, and determines whether the temperature change rate is larger than a first threshold. Afterwards, the thermal module 109 enables the modem module 105 to execute the frequency compensation process by using the paging signal 104 and the RF signal 106 when the temperature change rate is larger than the first threshold.

Conversely, when the indication signal 302 indicates that the BB processor 303 will be turned off, the thermal module 301 calculates a temperature difference between the heat source temperature and the ambient temperature, and determines whether the temperature difference is larger than a second threshold. And, the thermal module 301 enables the modem module 105 to execute the frequency compensation process by using the paging signal 104 and the RF signal 106 when the temperature difference is larger than the second threshold.

Figure 3B:
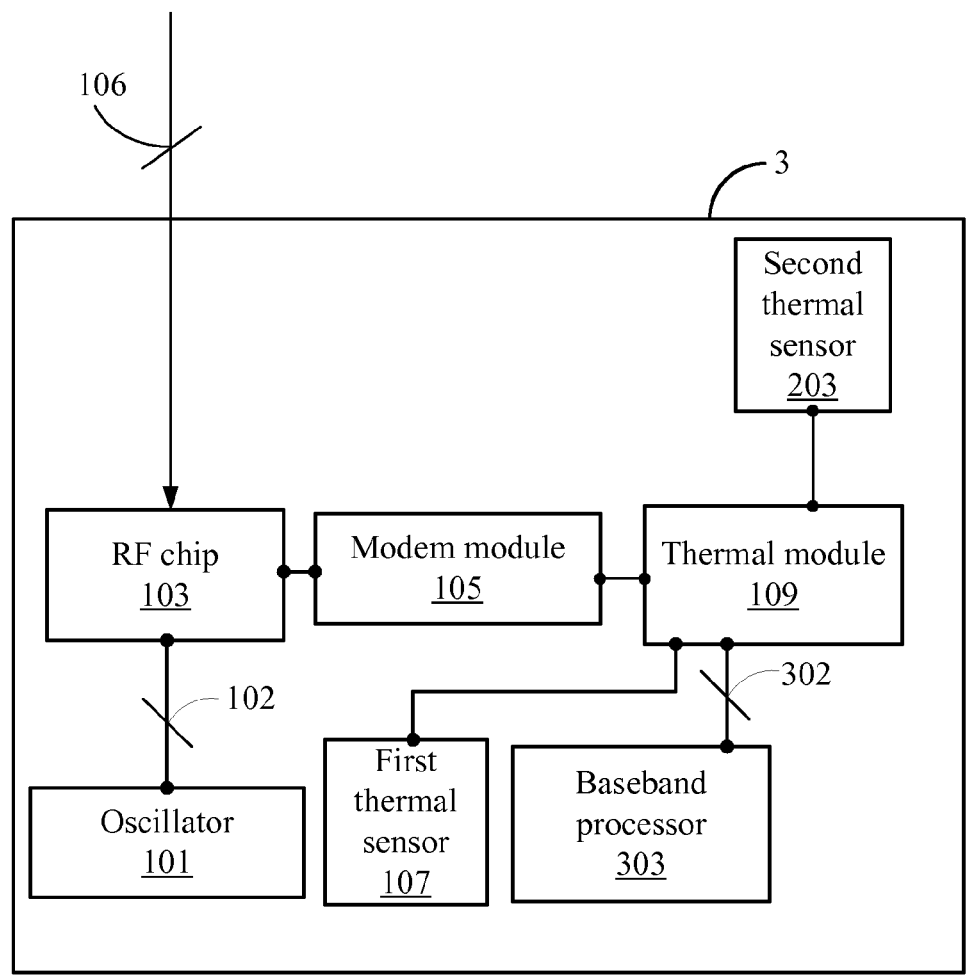
FIG. 3B is a schematic view of a handheld device 3 according to a another embodiment of the present invention.

Similarly, FIG. 3B shows another embodiment of the present invention. In this embodiment, the thermal module 109 triggers the modem module 105 to track the frequency offset by only utilizing the RF signal 106 instead of utilizing both the paging signal 104 and the RF signal 106 since the RF signal 106 frequently received from one or more of non-regular channels is enough for timely compensating the frequency offset.

Figure 4:
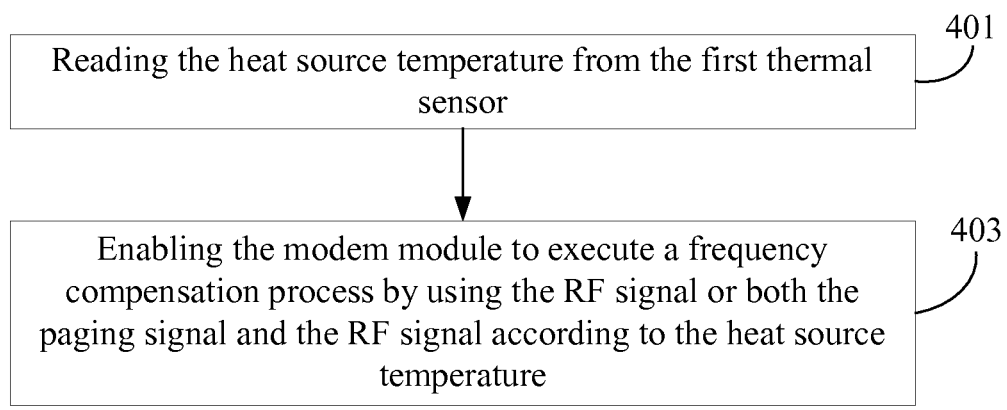
FIG. 4 is a flowchart diagram of a frequency tracking method according to the first embodiment and a fourth embodiment of the present invention.

A fourth embodiment of the present invention is a frequency tracking method, flowchart diagram of which is shown in FIG. 4. The frequency tracking method in this embodiment is adapted for use in a handheld device, e.g. the handheld device 1 described in the first embodiment. The handheld device comprises an oscillator, a radio frequency (RF) chip, a modem module, a first thermal sensor and a thermal module. The RF chip is configured to receive a paging signal from a paging channel and an RF signal from a non-regular channel based on an oscillation signal with an oscillation frequency generated by the oscillator. The first thermal sensor is disposed close to the oscillator and configured to measure a heat source temperature.

The frequency tracking method is executed by the thermal module. Firstly, step 401 is executed to read the heat source temperature from the first thermal sensor. Then, in step 403, the thermal module enables the modem module to execute a frequency compensation process by using the RF signal or both the paging signal and the RF signal according to the heat source temperature.

Figure 5:
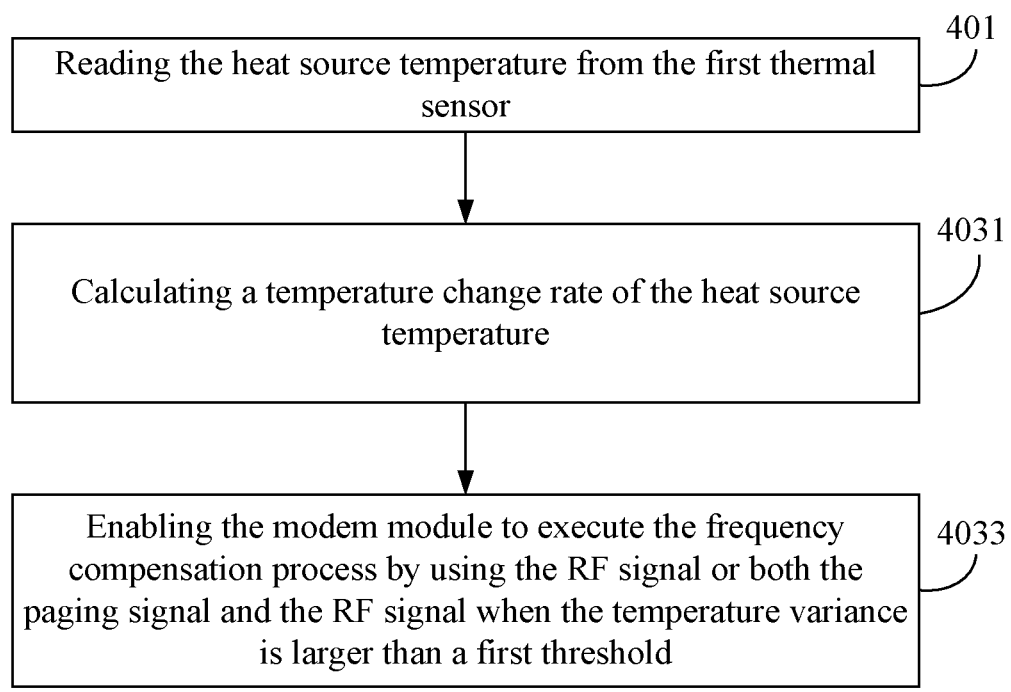
FIG. 5 is a flowchart diagram of a frequency tracking method according to the first embodiment and a fourth embodiment of the present invention.

For example, in another embodiment, step 403 may further comprises step 4031 and step 4033 as shown in FIG. 5. Step 4031 is executed to calculate a temperature change rate of the heat source temperature. Next, step 4033 is executed to enable the modem module to execute the frequency compensation process by using the RF signal or both the paging signal and the RF signal when the temperature change rate is larger than a first threshold. As a result, the modem module can be triggered timely to execute the frequency compensation process so as to prevent the failure of related modem channel reception.

In addition to the aforesaid steps, the frequency tracking method of this embodiment can also execute all the operations and corresponding functions set forth in the first embodiment. How this embodiment executes these operations and functions will be readily appreciated by those of ordinary skill in the art based on the explanation of the first embodiment, and thus will not be further described herein.

Figure 6A:
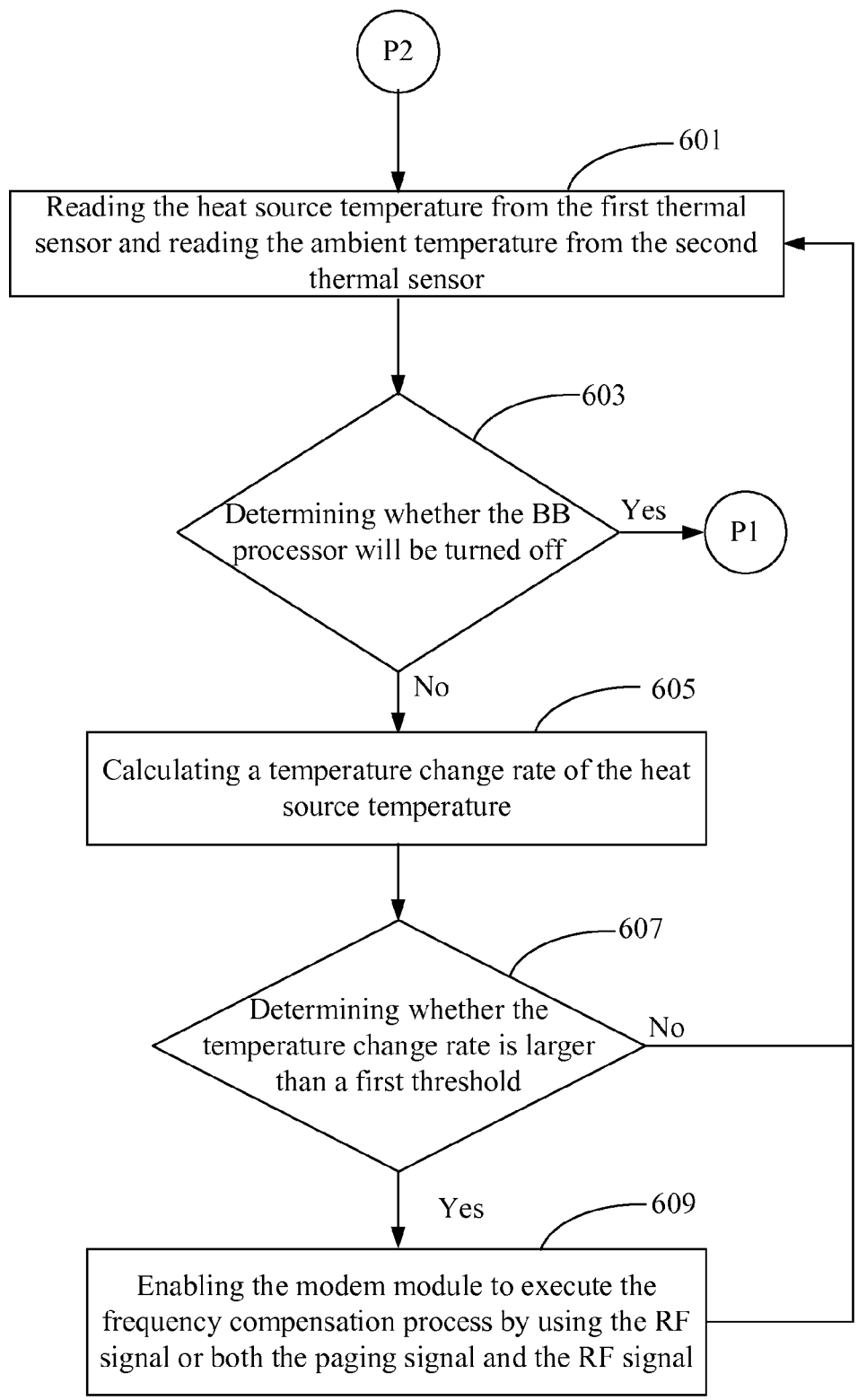
FIG. 6A and FIG. 6B are flowchart diagrams of a frequency tracking method according to the second embodiment and a fifth embodiment of the present invention.
Figure 6B:
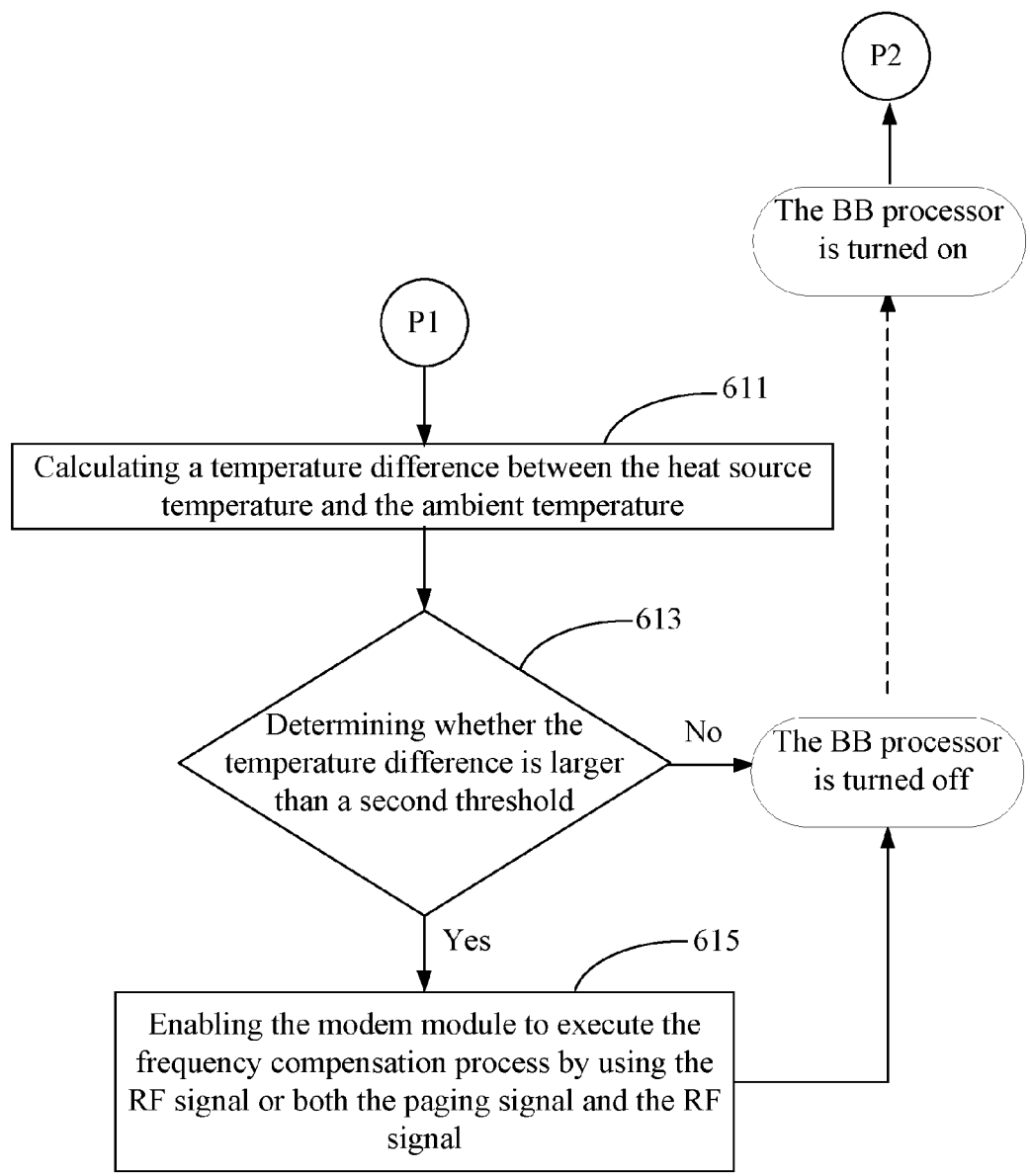

A fifth embodiment of the present invention is a frequency tracking method, flowchart diagrams of which are shown in FIG. 6A and FIG. 6B. The frequency tracking method is adapted for use in a handheld device, e.g. the handheld device 2 described in the second embodiment. The handheld device comprises an oscillator, a radio frequency (RF) chip, a modem module, a baseband (BB) processor, a first thermal sensor and a second thermal sensor.

The frequency tracking method is executed by the BB processor. Firstly, as shown in FIG. 6A, the BB processor reads the heat source temperature from the first thermal sensor and reads the ambient temperature from the second thermal sensor in step 601. Then, in step 603, the BB processor determines whether the BB processor will be turned off. If the BB processor will not be turned off, then step 605 is executed to calculate a temperature change rate of the heat source temperature. Next, in step 607, the BB processor determines whether the temperature change rate is larger than a first threshold. Thereafter, if the temperature change rate is larger than the first threshold in step 607, then step 609 is executed to enable the modem module to execute the frequency compensation process by using the RF signal or both the paging signal and the RF signal.

On the other hand, if the BB processor will be turned off in step 603, then step 611 is executed to calculate a temperature difference between the heat source temperature and the ambient temperature. Next, in step 613, the BB processor further determines whether the temperature difference is larger than a second threshold. Thereafter, if the temperature difference is larger than the second threshold in step 613, then step 615 is executed to enable the modem module to execute the frequency compensation process by using the RF signal or both the paging signal and the RF signal. As a result, either the temperature change rate is larger than the first threshold (when the BB processor will not be turned on) or the temperature difference is larger than the second threshold (when the BB processor will be turned on), the present invention could timely trigger the modem module to prevent the failure of the related modem channel reception due to the large change in temperature around the oscillator.

Moreover, as shown in FIG. 6A, the frequency tracking method further returns to execute step 601 if the temperature change rate is not larger than the first threshold in step 607 or after executing step 609. In addition, as shown in FIG. 6B, if the temperature difference is not larger than the second threshold in step 613 or after step 615, the BB processor is turned off in a short time. Step 601 will be executed again the next time when the BB processor is turned on.

In addition to the aforesaid steps, the frequency tracking method of this embodiment can also execute all the operations and corresponding functions set forth in the second embodiment. How this embodiment executes these operations and functions will be readily appreciated by those of ordinary skill in the art based on the explanation of the second embodiment, and thus will not be further described herein.

Figure 7A:
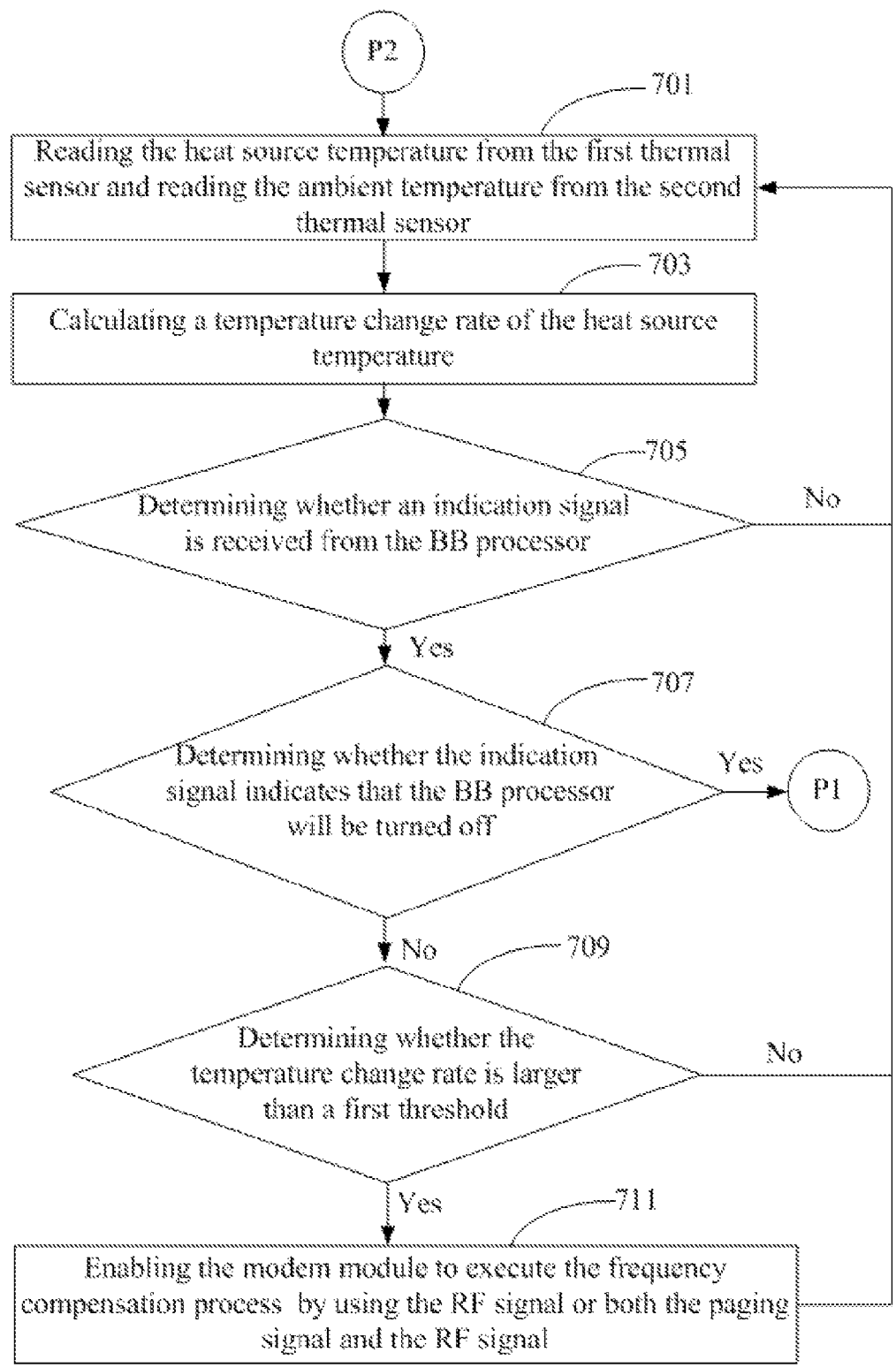
FIG. 7A and FIG. 7B are flowchart diagrams of a frequency tracking method according to the third embodiment and a sixth embodiment of the present invention.
Figure 7B:
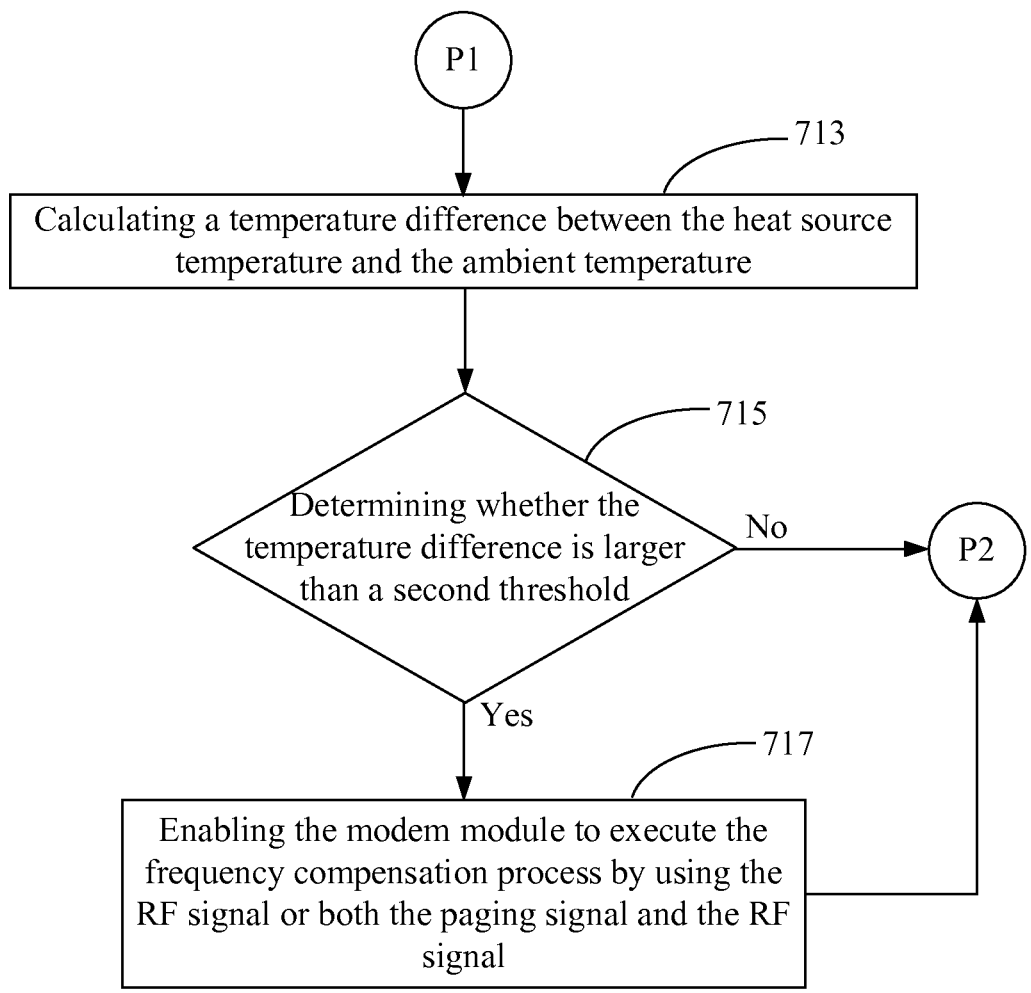

Please refer to FIG. 7A and FIG. 7B for a sixth embodiment of the present invention. FIG. 7A and FIG. 7B are flowchart diagrams of a frequency tracking method The frequency tracking method in this embodiment is adapted for use in a handheld device, e.g. the handheld device 3 described in the third embodiment. The handheld device comprises an oscillator, a radio frequency (RF) chip, a modem module, a baseband (BB) processor, a first thermal sensor and a second thermal sensor. The frequency tracking method in this embodiment is executed by the thermal module.

In step 701, the thermal module reads the heat source temperature from the first thermal sensor and reads the ambient temperature from the second thermal sensor. Then, in step 703, the thermal module calculates a temperature change rate of the heat source temperature. Next, in step 705, thermal module determines whether there is an indication signal received from the BB processor. The indication signal indicates that whether the BB processor will be turned off so that the thermal module could execute the next step according to the indication signal. After receiving the indication signal from the BB processor, the thermal module executes step 707 to determine whether the indication signal indicates that the BB processor will be turned off. If the indication signal indicates that the BB processor will not be turned off, the thermal module executes step 709 to further determine whether the temperature change rate is larger than a first threshold; otherwise, the thermal module 301 executes step 713 in FIG. 7B.

Next, if the temperature change rate is larger than the first threshold in step 709, then step 711 is executed to enable the modem module to execute the frequency compensation process by using the RF signal or both the paging signal and the RF signal.

On the other hand, if the indication signal indicates that the BB processor will be turned off in step 707, then the thermal module 301 executes step 713 to calculate a temperature difference between the heat source temperature and the ambient temperature. Next, in step 715, the thermal module 301 further determines whether the temperature difference is larger than a second threshold. If the temperature difference is larger than the second threshold in step 715, then step 717 is executed to enable the modem module to execute the frequency compensation process by using the RF signal or both the paging signal and the RF signal.

Furthermore, if there is no indication signal transmitted from the BB processor to the thermal module in step 705, if the temperature change rate is not larger than the first threshold in step 709, or after step 711, the frequency tracking method would return to execute step 701. In addition, if the temperature difference is not larger than the second threshold in step 715, or after step 717, the frequency tracking method would also return to execute step 701.

In addition to the aforesaid steps, the frequency tracking method of this embodiment can also execute all the operations and corresponding functions set forth in the third embodiment. How this embodiment executes these operations and functions will be readily appreciated by those of ordinary skill in the art based on the explanation of the third embodiment, and thus will not be further described herein.

According to the above descriptions, the frequency tracking mechanism of the present invention can timely trigger the modem module of the handheld device to execute the frequency compensation process according to the change in temperature around the oscillator. Therefore, the present invention could effectively prevent the failure of the related modem channel reception caused by the large frequency offset due to the large change in temperature of the oscillator. Thereby, the handheld device of the present invention has a high stability in communication.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A handheld device, comprising:
   an oscillator, being configured to generate an oscillation signal;
   a radio frequency (RF) chip, being electrically connected to the oscillator and configured to receive a paging signal from a paging channel and an RF signal from a non-regular channel based on the oscillation signal;
   a modem module, being electrically connected to the RF chip;
   a first thermal sensor, being disposed close to the oscillator and configured to measure a heat source temperature around the oscillator; and
   a thermal module, being electrically connected to the modem module and the first thermal sensor and configured to enable, based on whether a change of the heat source temperature reaches a threshold, the modem module to execute a frequency compensation process by using the RF signal or both the paging signal and the RF signal.

2. The handheld device as claimed in claim 1, wherein the thermal module is configured to calculate a temperature change rate of the heat source temperature, and enable the modem module to execute the frequency compensation process when the temperature change rate is larger than a first threshold.

3. The handheld device as claimed in claim 1, wherein the thermal module is a baseband (BB) processor, and the BB processor is configured to determine whether the BB processor will be turned off, calculate a temperature change rate of the heat source temperature, determine whether the temperature change rate is larger than a first threshold when the BB processor will not be turned off, and enable the modem module to execute the frequency compensation process when the temperature change rate is larger than the first threshold.

4. The handheld device as claimed in claim 1, further comprising a second thermal sensor being electrically connected to the thermal module and configured to measure an ambient temperature, wherein the thermal module is a baseband (BB) processor, and the BB processor is configured to determine whether the BB processor will be turned off, calculate a temperature difference between the heat source temperature and the ambient temperature when the BB processor will be turned off, determine whether the temperature difference is larger than a second threshold, and enable the modem module to execute the frequency compensation process when the temperature difference is larger than the second threshold.

5. The handheld device as claimed in claim 1, further comprising a baseband (BB) processor and a second thermal sensor, wherein the second thermal sensor is electrically connected to the thermal module and configured to measure an ambient temperature, the BB processor is electrically connected to the thermal module and configured to determine whether the BB processor will be turned off and transmit an indication signal to the thermal module, and the thermal module calculates a temperature change rate of the heat source temperature, determines whether the temperature change rate is larger than a first threshold when the indication signal indicating that the BB processor will not be turned off, and enables the modem module to execute the frequency compensation process when the temperature change rate is larger than the first threshold.

6. The handheld device as claimed in claim 1, further comprising a baseband (BB) processor and a second thermal sensor, wherein the second thermal sensor is electrically connected to the thermal module and configured to measure an ambient temperature, the BB processor is electrically connected to the thermal module and configured to determine whether the BB processor will be turned off and transmit an indication signal to the thermal module, and the thermal module calculates a temperature difference between the heat source temperature and the ambient temperature when the indication signal indicating that the BB processor will be turned off, determines whether the temperature difference is larger than a second threshold, and enables the modem module to execute the frequency compensation process when the temperature difference is larger than the second threshold.

7. The handheld device as claimed in claim 1, wherein the non-regular channel is one of a broadcast control channel (BCCH), a frequency correction control channel (FCCH), a synchronization channel (SCH), a cell broadcast channel (CBCH) and an access grant control channel (AGCH), a notification channel (NCH).

8. The handheld device as claimed in claim 1, wherein the non-regular channel is one of a common pilot channel (CPICH), a primary-common control physical channel (P-CCPCH), a secondary-common control physical channel (S-CCPCH), a synchronization channel (SCH), an acquisition indicator channel (AICH) and a paging indicator channel (PICH).

9. The handheld device as claimed in claim 1, wherein the non-regular channel is one of a physical broadcast channel (PBCH), a physical multicast channel (PMCH), a physical control format indicator channel (PCFICH), a physical hybrid ARQ indicator channel (PHICH), a physical downlink control channel (PDCCH) and a physical downlink shared channel (PDSCH).

10. The handheld device as claimed in claim 1, wherein the oscillator is one of a crystal oscillator and a digitally controlled oscillator.

11. A frequency tracking method for use in a handheld device, the handheld device comprising an oscillator, a radio frequency (RF) chip, a modem module, a first thermal sensor and a thermal module, the RF chip being configured to receiving a paging signal from a paging channel and an RF signal from a non-regular channel based on an oscillation signal generated by the oscillator, the first thermal sensor being disposed close to the oscillator and configured to measure a heat source temperature around the oscillator, the frequency tracking method being executed by the thermal module and comprising the following steps:
   (a) reading the heat source temperature from the first thermal sensor; and
   (b) enabling, based on whether a change of the heat source temperature reaches a threshold, the modem module to execute a frequency compensation process by using the RF signal or both the paging signal and the RF signal.

12. The frequency tracking method as claimed in claim 11, wherein the step (b) further comprises the following steps:
   calculating a temperature change rate of the heat source temperature; and
   enabling the modem module to execute the frequency compensation process when the temperature change rate is larger than a first threshold.

13. The frequency tracking method as claimed in claim 11, wherein the thermal module is a baseband (BB) processor, and the step (b) further comprises the following steps:
   determining whether the BB processor will be turned off;
   calculating a temperature change rate of the heat source temperature;
   determining whether the temperature change rate is larger than a first threshold when the BB processor will not be turned off; and
   enabling the modem module to execute the frequency compensation process when the temperature change rate is larger than the first threshold.

14. The frequency tracking method as claimed in claim 11, wherein the handheld device further comprises a second thermal sensor being configured to measure an ambient temperature, the thermal module is a baseband (BB) processor, the step (a) further comprises the following step:
   reading the ambient temperature from the second thermal sensor; and
   the step (b) further comprises the following steps:
   determining whether the BB processor will be turned off; and
   calculating a temperature difference between the heat source temperature and the ambient temperature when the BB processor will be turned off;
   determining whether the temperature difference is larger than a second threshold; and
   enabling the modem module to execute the frequency compensation process when the temperature difference is larger than the second threshold.

15. The frequency tracking method as claimed in claim 11, wherein the handheld device further comprises a baseband (BB) processor, and the step (b) further comprises the following steps:
   calculating a temperature change rate of the heat source temperature;
   determining whether the temperature change rate is larger than a first threshold after receiving an indication signal indicating that the BB processor will not be turned off from the BB processor; and
   enabling the modem module to execute the frequency compensation process when the temperature change rate is larger than the first threshold.

16. The frequency tracking method as claimed in claim 11, wherein the handheld device further comprises a baseband (BB) processor and a second thermal sensor configured to measure an ambient temperature, the step (a) further comprises the following step:
   reading the ambient temperature from the second thermal sensor; and
   the step (b) further comprises the following steps:
   calculating a temperature difference between the heat source temperature and the ambient temperature after receiving an indication signal indicating that the BB processor will be turned off from the BB processor;
   determining whether the temperature difference is larger than a second threshold; and
   enabling the modem module to execute the frequency compensation process when the temperature difference is larger than the second threshold.

17. The frequency tracking method as claimed in claim 11, wherein the non-regular channel is one of a broadcast control channel (BCCH), a frequency correction control channel (FCCH), a synchronization channel (SCH), a cell broadcast channel (CBCH), an access grant control channel (AGCH), and a notification channel (NCH).

18. The frequency tracking method as claimed in claim 11, wherein the non-regular channel is one of a common pilot channel (CPICH), a primary-common control physical channel (P-CCPCH), a secondary-common control physical channel (S-CCPCH), a synchronization channel (SCH), an acquisition indicator channel (AICH) and a paging indicator channel (PICH).

19. The frequency tracking method as claimed in claim 11, wherein the non-regular channel is one of a physical broadcast channel (PBCH), a physical multicast channel (PMCH), a physical control format indicator channel (PC-FICH), a physical hybrid ARQ indicator channel (PHICH), a physical downlink control channel (PDCCH) and a physical downlink shared channel (PDSCH).

20. The frequency tracking method as claimed in claim 11, wherein the oscillator is one of a crystal oscillator and a digitally controlled oscillator.

* * * * *